(12) United States Patent
Honda et al.

(10) Patent No.: US 9,362,200 B2
(45) Date of Patent: Jun. 7, 2016

(54) HEAT SINK IN THE APERTURE OF SUBSTRATE

(71) Applicant: J-DEVICES CORPORATION, Oita (JP)

(72) Inventors: Hirokazu Honda, Kanagawa (JP); Shinji Watanabe, Kanagawa (JP); Toshihiro Iwasaki, Kanagawa (JP); Kiminori Ishido, Kanagawa (JP); Koichiro Niwa, Kanagawa (JP); Takeshi Miyakoshi, Kanagawa (JP); Sumikazu Hosoyamada, Kanagawa (JP); Yoshikazu Kumagaya, Kanagawa (JP); Tomoshige Chikai, Kanagawa (JP); Shingo Nakamura, Kanagawa (JP); Shotaro Sakumoto, Kanagawa (JP); Hiroaki Matsubara, Kanagawa (JP)

(73) Assignee: J-DEVICES CORPORATION, Oita (JP)

( * ) Notice: Subject to any disclaimer, the term of this patent is extended or adjusted under 35 U.S.C. 154(b) by 0 days.

(21) Appl. No.: 14/744,946

(22) Filed: Jun. 19, 2015

(65) Prior Publication Data
US 2015/0371934 A1 Dec. 24, 2015

(30) Foreign Application Priority Data
Jun. 19, 2014 (JP) ................................. 2014-126480

(51) Int. Cl.
| | | |
|---|---|---|
| *H01L 23/12* | (2006.01) | |
| *H01L 21/00* | (2006.01) | |
| *H01L 23/367* | (2006.01) | |
| *H01L 23/31* | (2006.01) | |
| *H01L 23/498* | (2006.01) | |
| *H01L 23/538* | (2006.01) | |
| *H01L 23/40* | (2006.01) | |
| *H01L 23/13* | (2006.01) | |

(52) U.S. Cl.
CPC ........ *H01L 23/3675* (2013.01); *H01L 23/3121* (2013.01); *H01L 23/3677* (2013.01); *H01L 23/49811* (2013.01); *H01L 23/13* (2013.01); *H01L 23/4006* (2013.01); *H01L 23/49816* (2013.01); *H01L 23/5389* (2013.01); *H01L 2224/18* (2013.01)

(58) Field of Classification Search
CPC ............ H01L 23/367; H01L 23/49838; H01L 23/5386; H01L 23/3675; H01L 23/49816; H01L 21/2846
See application file for complete search history.

(56) References Cited

U.S. PATENT DOCUMENTS

| | | | | | |
|---|---|---|---|---|---|
| 5,285,352 | A | * | 2/1994 | Pastore | ................... H01L 23/36 165/185 |
| 5,583,377 | A | * | 12/1996 | Higgins, III | ............ H01L 23/13 257/706 |
| 5,729,432 | A | * | 3/1998 | Shim | ...................... H01L 23/13 165/80.3 |

(Continued)

FOREIGN PATENT DOCUMENTS

JP 2010-040911 A 2/2010

*Primary Examiner* — Alonzo Chambliss
(74) *Attorney, Agent, or Firm* — Typha IP LLC

(57) ABSTRACT

A semiconductor package includes a support substrate arranged with a first aperture reaching a semiconductor device on a rear side, the semiconductor device is bonded via an adhesive to a surface of the support substrate, an insulating layer covering the semiconductor device, and wiring for connecting the semiconductor device and an external terminal through the insulating layer. The adhesive may form a part of the first aperture. In addition, a heat dissipation part may be arranged in the first aperture and a metal material may be filled in the first aperture.

20 Claims, 14 Drawing Sheets

(56) References Cited

U.S. PATENT DOCUMENTS

| | | | | |
|---|---|---|---|---|
| 7,241,645 B2* | 7/2007 | Zhao | ............ | H01L 23/3677 257/706 |
| 7,781,682 B2* | 8/2010 | Bahadur | ............ | H01L 21/56 174/521 |
| 2009/0294947 A1* | 12/2009 | Tain | ............ | H01L 25/0657 257/686 |
| 2011/0133329 A1* | 6/2011 | Takahashi | ............ | H01L 21/561 257/712 |
| 2014/0339692 A1* | 11/2014 | Kim | ............ | H01L 25/105 257/713 |

* cited by examiner

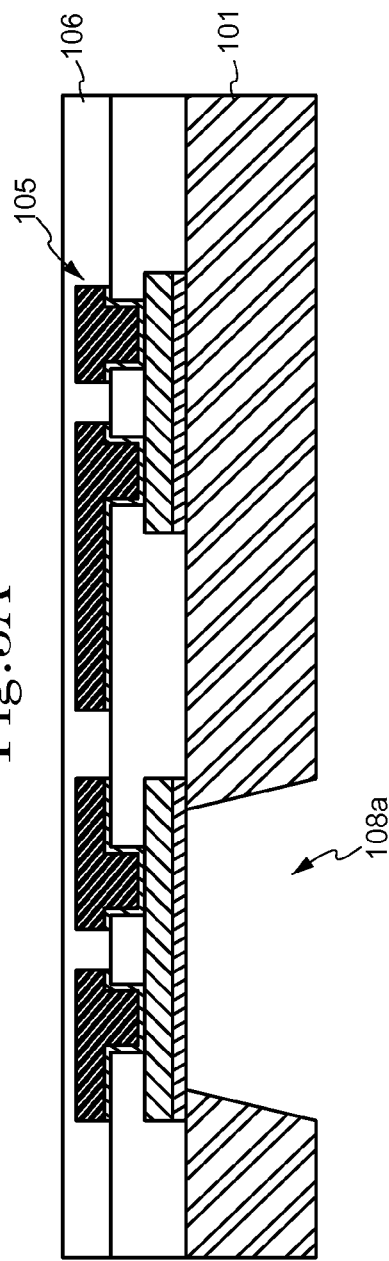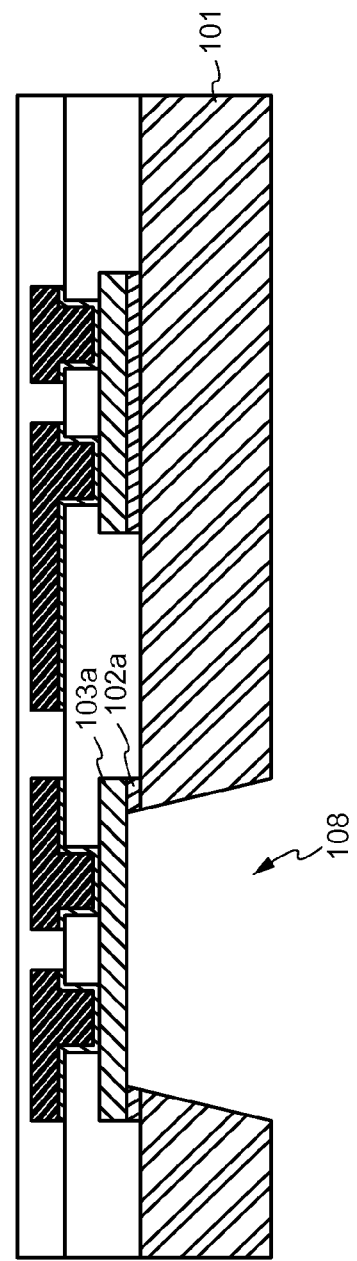

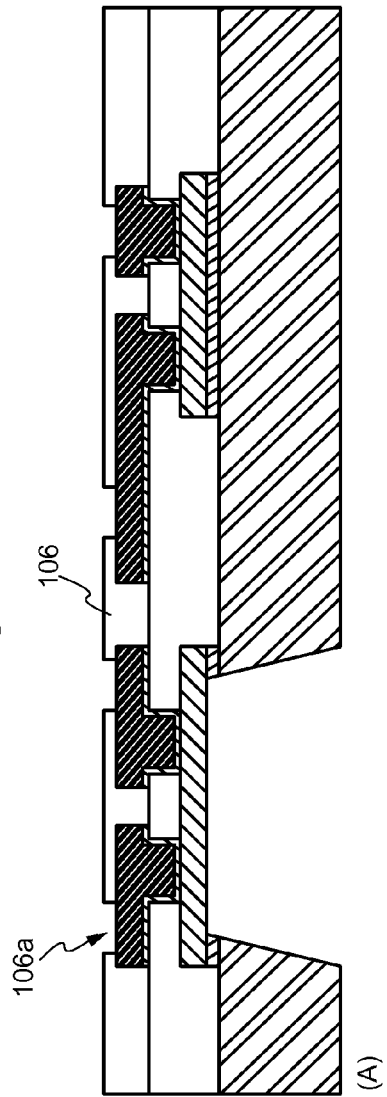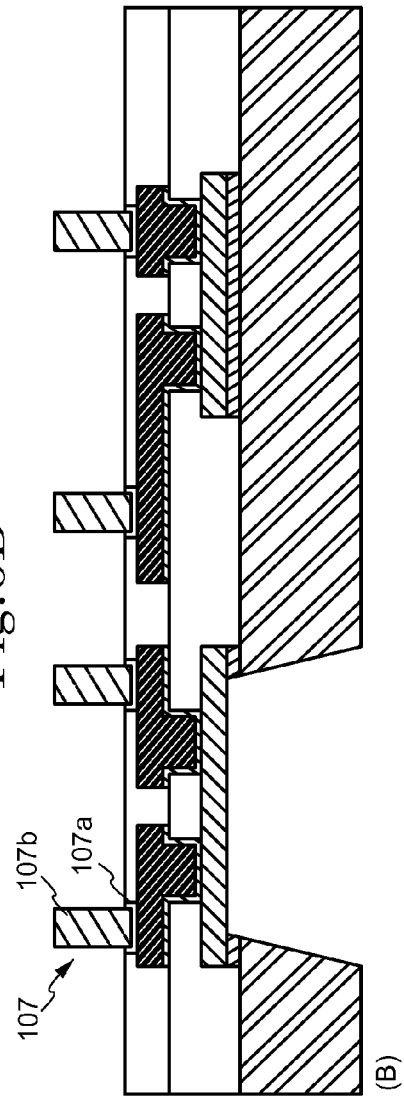

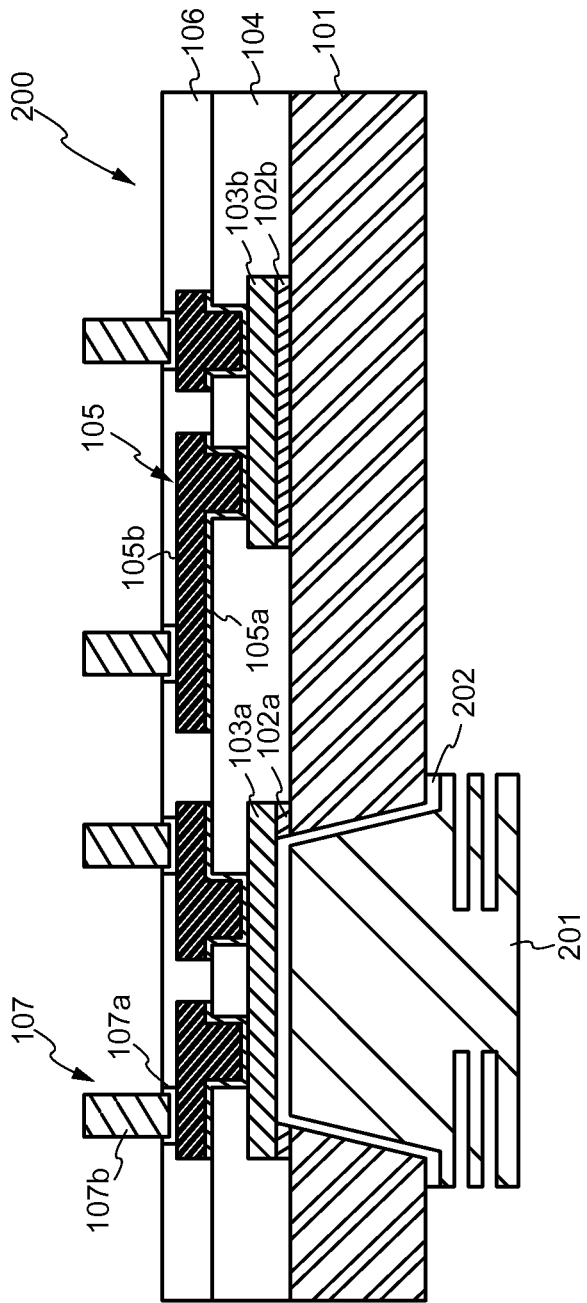

HEAT SINK IN THE APERTURE OF SUBSTRATE

CROSS REFERENCE TO RELATED APPLICATIONS

This application is based on and claims the benefit of priority from the prior Japanese Patent Application No. 2014-126480, filed on 19 Jun. 2014, the entire contents of which are incorporate herein by reference.

FIELD

The present invention relates to a structure of a semiconductor package. In particular, the present invention is related to a heat dissipation structure of a semiconductor package in the case of using a power device as a semiconductor device.

BACKGROUND

Conventionally, a semiconductor package for mounting a semiconductor device such as an IC chip on a support substrate is known. Such a semiconductor package is, in general, bonded with a semiconductor device such as an IC chip via the adhesive called a die attach material above a support substrate, and a structure is adopted whereby the semiconductor device is covered and protected by a sealing part (sealing resin).

Various substrates such as a printed substrate or ceramic substrate are used as the support substrate used in a semiconductor package. In recent years, the development of a semiconductor package using a metal substrate as a substrate has progressed. A semiconductor package using a metal substrate has advantages such as excellent electromagnetic shielding properties and thermal properties and has attracted attention as a highly reliable semiconductor package (Japanese Laid Open Patent 2010-40911).

SUMMARY

A semiconductor package related to one embodiment of the present invention includes a support substrate, a semiconductor device (in particular a power device) bonded via an adhesive to a surface of the support substrate, an insulating layer covering the semiconductor device, and wiring for connecting the semiconductor device and an external terminal (pin shaped conductor or solder ball) through the insulating layer, wherein a first aperture reaching a semiconductor device is arranged on a rear side of the support substrate.

The adhesive may form a part of the first aperture by etching using the aperture arranged in the support substrate as a mask.

A part of the semiconductor device may be exposed to the outside air through the first aperture. In addition, a heat dissipation part may be arranged in the first aperture via a heat dissipation adhesive, a metal material may be filled and a conductive pattern may be arranged to cover the first aperture.

In addition, a second aperture reaching the semiconductor device may be arranged in the insulation layer, and a part of the semiconductor device may be exposed to the outside air via the second aperture. In addition, a heat dissipation part may be arranged in the second aperture.

A method of manufacturing a semiconductor package related to one embodiment of the present invention includes a support substrate, a semiconductor device (in particular a power device) bonded via an adhesive to a surface of the support substrate, an insulating layer covering the semiconductor device, and wiring for connecting the semiconductor device and an external terminal (pin shaped conductor or solder ball) through the insulating layer, wherein a step of forming a first aperture reaching a semiconductor device arranged on a rear side of the support substrate is also included.

A step of forming an aperture by etching the rear side of the support substrate and a step of etching the adhesive using the aperture as a mask may be further included.

Any one of a step of forming a heat dissipation part in the first aperture using a heat dissipation adhesive after forming the first aperture, a step of filling a metal material, and a step of forming a conductive pattern to cover the first aperture may be included.

A step of forming a second aperture reaching the semiconductor device in the insulation layer may be included and a step forming a heat dissipation part in the second aperture may also be included.

Related to the present invention, it is possible to realize a semiconductor device with excellent heat dissipation properties and high reliability by arranging an aperture in a support substrate and directly contacting a part of the semiconductor device with outside air or a dissipation part.

BRIEF DESCRIPTION OF DRAWINGS

FIG. 5A is a diagram showing a manufacturing process of a semiconductor package related to the first embodiment of the present invention;

FIG. 5B is a diagram showing a manufacturing process of a semiconductor package related to the first embodiment of the present invention;

FIG. 6A is a diagram showing a manufacturing process of a semiconductor package related to the first embodiment of the present invention;

FIG. 6B is a diagram showing a manufacturing process of a semiconductor package related to the first embodiment of the present invention;

FIG. 7 is a cross-sectional view of a semiconductor package related to a second embodiment of the present invention;

DESCRIPTION OF EMBODIMENTS

Figure 1:
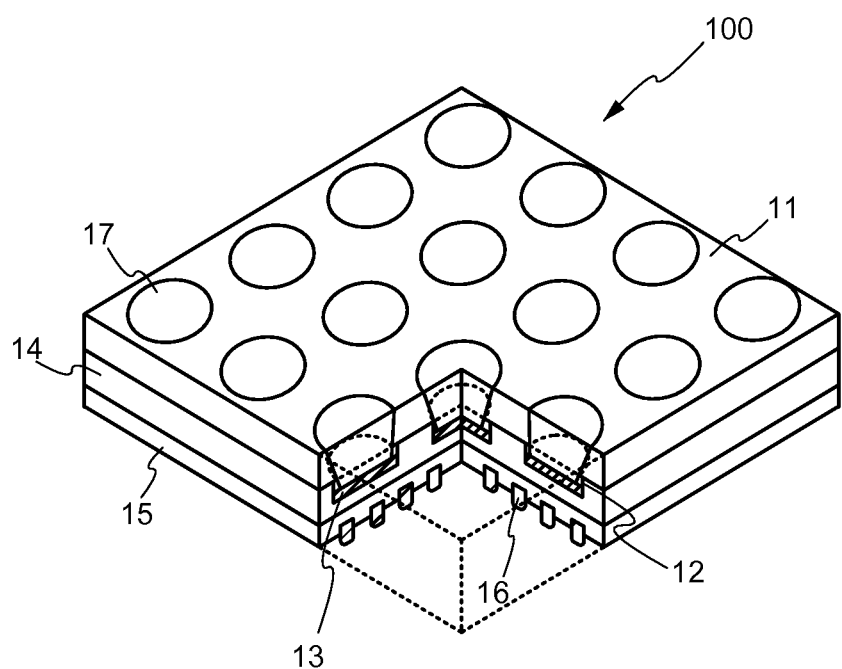
FIG. 1 is a perspective view of a semiconductor package related to a first embodiment of the present invention.

The present inventors have found that high heat dissipation properties of a metal substrate are considered to be useful in the case where a power device is used as a semiconductor device and that development has been focused on a semiconductor package equipped with a power device on a metal substrate. Since power devices are semiconductor device that handle a large voltage and a large current, the amount of heat emitted is very high and therefore high heat dissipation properties are required.

In the case where a metal substrate is employed as the package structure of a power device, it is possible to realize a package structure with excellent heat dissipation characteristics. However, in next-generation power devices which use, for example, SiC (silicon carbide) and GaN (gallium nitride) as a substrate, an operating environment with a junction temperature (Tj) of 175~250° C. and a very high temperature has been assumed which means that further heat dissipation characteristics have come to be required for a package structure.

The present invention has been made in view of such problems and an object of the invention is to provide a highly reliable semiconductor package having excellent heat dissipation properties.

A semiconductor package related to one embodiment of the present invention is explained in detail with reference to the drawings. The embodiments shown below are example embodiments of the present invention and the present invention is not limited to these embodiments.

In the drawings referred to in the present embodiment, parts having the same components or similar features have the same reference numerals or similar reference numerals (only reference numerals denoted with A, B, etc after a number.), and repeated explanations may be omitted. In addition, A and B after the number are sometimes omitted and only the number is shown (for example, "10a" and "10b" maybe described as "10"). In addition, the dimensional ratios in the drawings may be different from the actual ratios for the convenience of explanation and parts of the configuration may be omitted from the drawing.

First Embodiment

<Package Appearance>

FIG. 1 is an external view of a semiconductor package 100 related to the first embodiment of the present invention. In addition, the front part of FIG. 1 illustrates a cut surface in order to show the appearance of the internal structure.

In FIG. 1, numbering 11 is a support substrate, numbering 12 is an adhesive (also referred to as a die attach material) arranged on the surface (surface on the side where the semiconductor device is to be mounted) of the support substrate. numbering 13 is a semiconductor device such as an IC chip or an LSI chip, in particular, here a power device (for example, a rectifier diode, a power transistor, a thyristor, a gate turn-off thyristor, or triac, etc.) are mounted.

A sealing resin for example can be used for a sealing part (insulating layer) 14 and 15 for protecting the semiconductor device 13. Although not shown in the diagram, wiring is formed within the sealing part 14, 15, and the output terminals of the semiconductor device 13 are electrically connected to the external terminal 16.

In addition, the semiconductor package 100 related to the first embodiment, is arranged with an aperture 17 reaching the semiconductor device 13 on the rear surface of the support substrate 11 side (the surface opposite the surface on which the semiconductor device is mounted). Although details are described below, the aperture 17 is formed by etching the support substrate 11 and the adhesive 12 and a part of the semiconductor device 13 is exposed. In the semiconductor package 100 related to the first embodiment, the aperture 17 functions as a heat dissipation part.

Furthermore, an aperture (aperture formed by etching the support substrate and the adhesive material) arranged on the rear surface side of the support substrate may be referred to herein as "first aperture". Conversely, an aperture (aperture formed by etching the sealing part) arranged on the top surface side of the support substrate described below may be referred to as "second aperture".

In this way, the semiconductor package 100 related to the present embodiment has a structure using the support substrate 11 as it is as a substrate to protect the semiconductor device 13 from the outside air by a stacked resin layer (sealing part 14, 15). In addition, the aperture 17 for heat dissipation is arranged on the rear surface of the support substrate 11 and a semiconductor package with excellent heat dissipation characteristics is realized.

<Package Structure>

Figure 2:
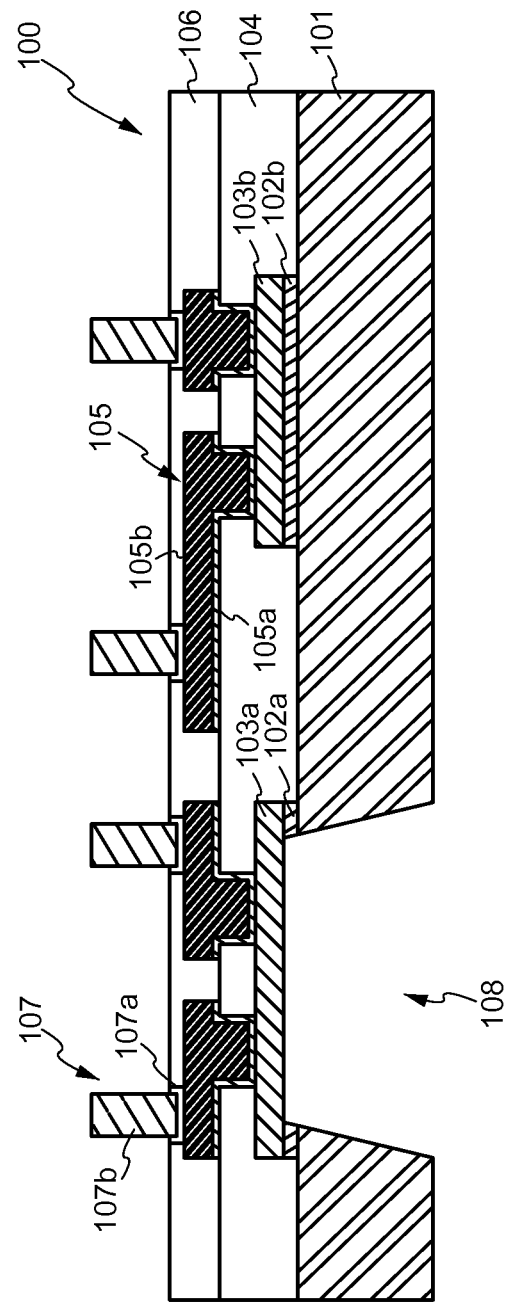
FIG. 2 is a cross-sectional view of a semiconductor package related to the first embodiment of the present invention.

FIG. 2 is a cross-sectional view for explaining in detail the structure of a semiconductor package 100 described with reference to FIG. 1. Numbering 101 is a support substrate, here a metal substrate is used. As a metal substrate, iron alloy substrates such as stainless steel, copper alloy substrate, may be used an alloy substrate such as an aluminum alloy substrate. Of course, it is not necessary to limit the substrate to a metal substrate, depending on the application and cost, a silicon substrate, a ceramic substrate and an insulating resin substrate can also be used.

Semiconductor devices 103a, 103b are arranged via an adhesive material 102a, 102b n the support substrate 101. Adhesive 102 is a part for bonding the support substrate 101 and the semiconductor device 103, and in this embodiment, a known die attach film (die attach sheet) is used.

Semiconductor device 103 is a semiconductor element such as an IC chip or an LSI chip. In the semiconductor package 100 related to the first embodiment, the semiconductor device 103a is a power device, the semiconductor device 103b is a MOSFET (MOS field effect transistor) and a diode. Although not shown in the diagram, such as a plurality of power devices and MOSFET may be arranged on the support substrate 101. The upper surface and side surface of the semiconductor devices 103a, 103b are covered by a first sealing part 104 and protected from the external environment. As the first sealing part 104, although it is possible to use an epoxy resin, any material can be used as long as it is a known sealing resin.

Wiring 105 is formed on the first sealing part 104. Here, the wiring 105 is formed using a copper seed layer 105a and a copper wiring 105b. Of course, it is not limited to copper, aluminum or silver or any known material can be used as long as the material can ensure good electrical connection between the semiconductor devices.

The second sealing part 106 is arranged on the wiring 105 and an external terminal 107 is arranged above this through a contact hole. The same material may be used for the second sealing part 106 as the first sealing part 104, and since there is direct contact with the outside air, a different material with excellent functionality as a more protective film may be used. In the present embodiment, an epoxy-based resin is used.

External terminals 107 may be solder balls or may be a pin-shaped metal part. For example, it is possible to form a pin-shaped metallic part by stacked gold bumps 107b by electrolytic plating on a UBM (Under Bump Metal) layer 107. In addition, it is also possible to form the pin-shaped external terminals 107 using a Cu or Cu alloy as the metal part. At that time, a solder material such as Sn—Ag—Cu, Sn—Cu Pb—Sn may be used as a brazing material.

The semiconductor package 100 related to the first embodiment of the present invention described above, the first aperture 108 is arranged with a first aperture 108 on the rear side of the support substrate 101. The first aperture 108 reaches the rear surface of the semiconductor device 103a (surface opposite the circuit forming surface), and an aperture is arranged in an aperture arranged on the support substrate 101 and the adhesive 102a. In other words, the adhesive 102a also forms a part of the first aperture 108.

By exposing the rear surface of the semiconductor device 103a to the outside air, the first aperture 108 functions as a heat dissipation part to improve heat dissipation characteristics. In particular, due to the use of the power device as the semiconductor device 103a in the semiconductor package 100 of the first embodiment, these heat dissipation effects are remarkable.

Although basically the larger the area of the exposed surface of the semiconductor device 103a is, heat dissipation effects can be increased, preferably, 60% or more (more preferably 90% or more) of the rear surface of the area of the semiconductor device 103 may be exposed. In FIG. 2, although a single aperture is shown, a structure comprised of a plurality of apertures is also possible.

In addition, the shape of the first aperture 108 is not limited to a circular shape, a rectangular shape or a polygonal shape is also possible. For example, if the semiconductor device 103a is a rectangular IC chip, by arranging a rectangular first aperture 108, it is possible to efficiently ensure an exposed surface.

<Manufacturing Process>

FIGS. 3 to 6 are diagrams showing a manufacturing process of the semiconductor package 100 related to the first embodiment of the present invention. In FIG. 3A, first, a metal substrate is prepared as the support substrate 101. Here, although an iron alloy stainless steel substrate (SUS substrate) as the metal substrate is used, a substrate composed of other materials may be used as long as the substrate has a certain rigidity. For example, a silicon substrate, a ceramic substrate, and an insulating resin substrate may be used.

Next, the semiconductor device 103 is placed on the support substrate 101 using a die attach film as an adhesive 102. Specifically, first, a plurality of semiconductor devices are formed by a known semiconductor process on a wafer (semiconductor element), and a back grinding process (thinning of the wafer) is performed in a state where the die attach film is bonded to the semiconductor device.

Following this, a plurality of semiconductor devices were singulated by a dicing process, and the plurality of semiconductor devices 103 bonded to the adhesive 102 are adhered on the support substrate 101. Specifically, a semiconductor device (power device) 103a is placed via the adhesive 102a and the semiconductor device (MOSFET) 103b is placed via an adhesive 102b.

Figure 3A:
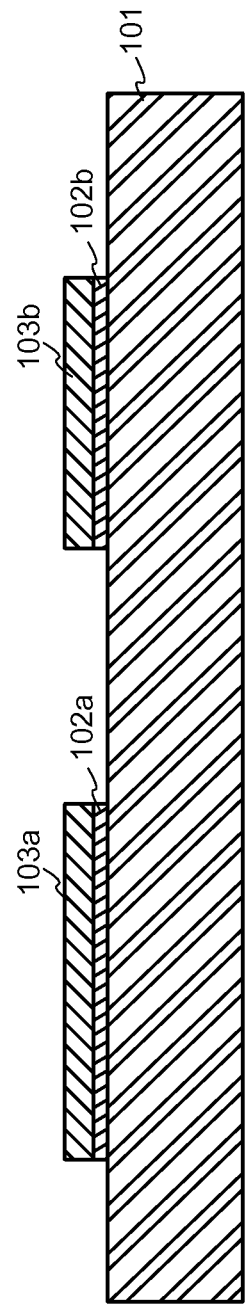
FIG. 3A is a diagram showing a manufacturing process of a semiconductor package related to the first embodiment of the present invention.
Figure 3B:
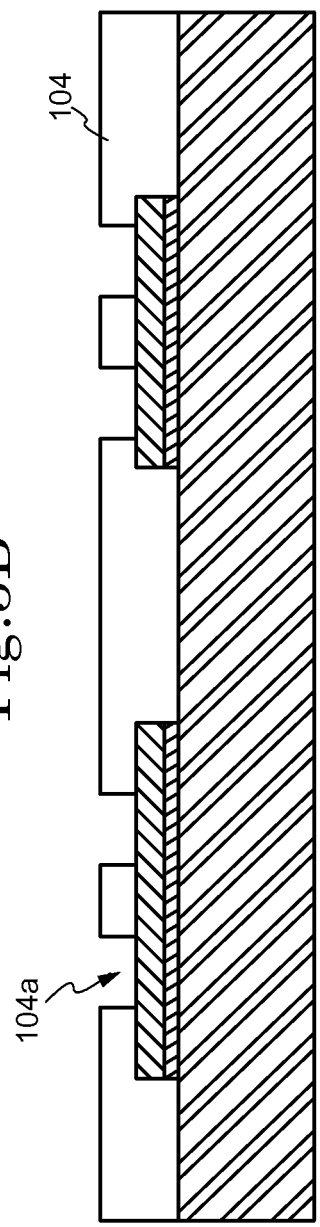
FIG. 3B is a diagram showing a manufacturing process of a semiconductor package related to the first embodiment of the present invention.

Next, as is shown in FIG. 3B, a first sealing part 104 is formed so as to cover the semiconductor device 103. As the first sealing part 104, it is possible to use epoxy resins, phenolic resins, cyanate ester resins, acrylic resins, polyamide-imide resins, and one of the polyimide resins. A thermosetting resin or a photocurable resin may also be used. A screen printing method, a spin coating method or any known coating method may be used for the first sealing part 104.

After forming the first sealing part 104, the next step is to perform patterning on the first sealing part 104 using a known photolithography technique to form a plurality of contact holes 104a. These contact holes 104a ensure the electrical connection between the copper wiring 105 and the semiconductor device 103 to be formed later.

Figure 4A:
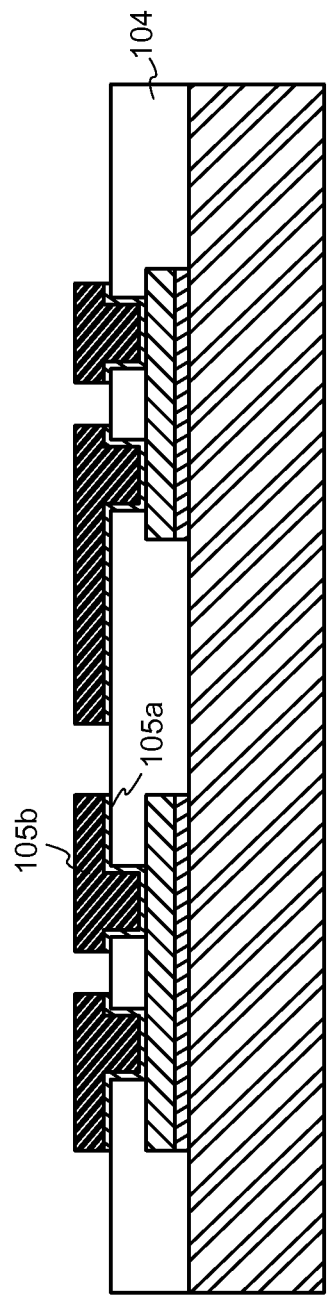
FIG. 4A is a diagram showing a manufacturing process of a semiconductor package related to the first embodiment of the present invention.

Next, as is shown in FIG. 4A, copper wiring 105 comprised from a copper seed layer 105a and a copper wiring 105b is formed. Copper seed layer 105a which forms the base of copper plating is selectively formed with respect to the contact hole 104a as shown in FIG. 3B, then, a copper wiring 105b is formed by copper plating.

Electroplating or electroless plating may be used for the copper plating. In the present embodiment, although copper wiring 105 is formed by copper plating, it is not limited to this, it is possible to form copper wiring 105 using other methods. For example, a known CVD method such as a sputtering method or an evaporation method may be used.

Figure 4B:
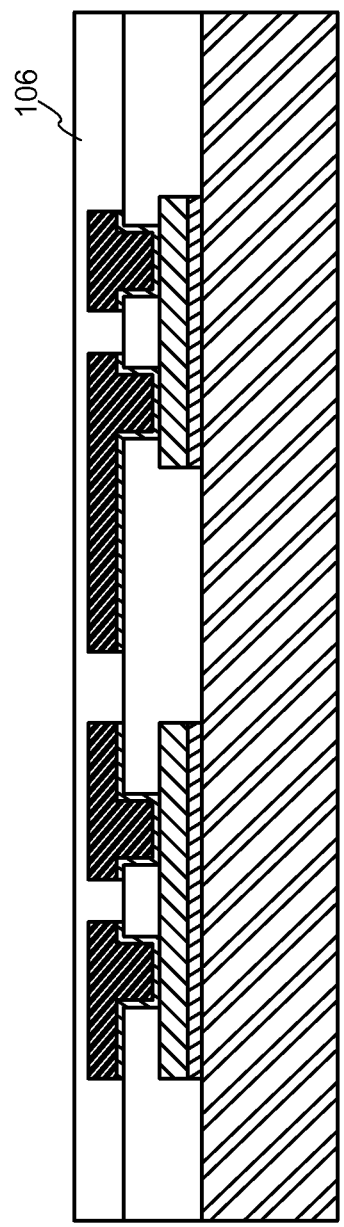
FIG. 4B is a diagram showing a manufacturing process of a semiconductor package related to the first embodiment of the present invention.

Next, as is shown in FIG. 4B, a second sealing part 106 is formed. With respect to the formation of the second sealing part 106, although it may be the same as the first sealing part 104, in this embodiment, since it also functions as a protective layer when forming the first aperture 108 in the support substrate 101 later, it is desirable to use a good insulator with waterproof properties and chemical resistance.

Next, as is shown in FIG. 5A, etching is performed from the rear side of the support substrate 101 to form an aperture 108a (here, only the support substrate 101 is etched). Formation of the aperture 108a in the present embodiment is performed by wet etching using a resist mask (not shown in the diagram). Specifically, as an etchant, it is possible to use ferrous sulfate solution, copper sulfate solution, iron chloride solution, the copper chloride solution or the like. The Type of etchant may be appropriately selected depending on the metal material constituting the support substrate 101.

Furthermore, in the present embodiment, although an example of forming an aperture part 108a by wet etching is shown, dry etching and laser etching may also be used. However, when using wet etching, as is shown in FIG. 5A, since an adhesive 102 functions as an etching stopper, it is possible to reduce etching damage to the semiconductor device 103.

In addition, in the present embodiment, in order to perform a wet etching process in a state where the copper wiring 105 is protected by the second sealing part 106, even if the etchant wraps around the front side of the support substrate, the copper wiring 105 is not affected by the etchant.

After the aperture 108a is formed in the support substrate 101 by wet etching, next, as is shown in FIG. 5B, an adhesive 102a is etched is self-aligned manner (self-aligned) using the aperture part 108a as a mask (that is, using the support substrate 101 as an etching mask). Ashing, dry etching, laser etching, etc., or a known etching technique can be used for etching of the adhesive 102a. In this case, in order to reduce damage to the semiconductor device 103a as much as possible, it is desirable to select an etching condition to secure sufficient selectivity between the adhesive 102a and the semiconductor device 103a. In addition, in particular, when using laser etching, in the case where adhesive 102a is carbonized and a carbide layer is produced after laser processing, a wet etching process using a potassium permanganate solution and the like (residue removal process, also referred to as desmearing) may be added.

In this way, after forming the first aperture 108, next, as shown in FIG. 6A, a plurality of contact holes 106a are formed in the second sealing part 106.

Furthermore, as is shown in FIG. 6B, a plurality of pin-shaped metal parts is formed as external terminals 107. Here, the external terminals 107 are comprised from a known UBM (under Bump Metal) 107a and gold bump 107b. Furthermore, in this embodiment, although gold is used as the metal material, metal materials such as copper, solder and nickel may be used to form bumps.

In addition, instead of the pin-shaped metal part, as structure arranged with solder balls may be adopted as the external terminals 107.

Through the manufacturing process described above, the semiconductor package 100 related to the first embodiment shown in FIGS. 1 and 2 is completed. According to the present invention, a semiconductor device 103, in particular the lower part of the power device 103a (support substrate side), is arranged with a first aperture 108 formed by etching the support substrate 101 and adhesive 102, and a part of the power device 103a is exposed to the outside air.

In this way, even in case of mounting a power device assuming an operating environment of high temperature regions such as 175° C.~250° C., since the power device 103a is always cooled via the first aperture 108 by the outside air, it is possible to realize a highly reliable semiconductor package with excellent heat dissipation characteristics.

Furthermore, in the present embodiment, although an example is shown in which a first aperture 108 is arranged only on the lower side of the power device 103a, first aperture 108 may also be arranged on the lower side of the MOSFET 103b if necessary. In this case, since the dissipation effect of the entire semiconductor package is increased, it is possible to realize a semiconductor package with greater excellent heat dissipation characteristics.

Furthermore, in the present embodiment, although an example is shown of forming one aperture on the lower side of the power device 103a, it is possible to form a plurality of apertures. In this case, it is possible to improve impact resistance in the lower part of power device 103a.

Second Embodiment

FIG. 7 shows a cross-sectional view of a semiconductor package 200 related to the second embodiment of the present invention. Semiconductor package 200 related to the second embodiment is different from the semiconductor package 100 of the first embodiment in that a heat sink 201 is arranged in the first aperture 108. Other points are the same as the semiconductor package 100 related to the first embodiment.

In FIG. 7, the heat sink 201 is bonded to the semiconductor device (power device) 103a using a heat dissipation adhesive 202. The heat sink 201 may be a metallic part such as copper or aluminum. As the heat dissipation adhesive 202, aluminum (Al), aluminum nitride (AlN), silicon carbide (SiC), or boron nitride (BN) or a silicon resin or a metal material such as a solder combining these may be used.

In addition, in the present embodiment, although a structure is shown in which the heat sink 201 is arranged using a heat dissipation adhesive 202, the heat sink and a heat spreader may be used in combination.

Semiconductor package 200 related to the second embodiment of the present invention can effectively dissipate heat emitted by the semiconductor device 103a by bringing the heat sink or heat spreader which are the semiconductor device 103a and the dissipation structure close together. Therefore, it is possible to realize a highly reliable semiconductor package with more excellent heat dissipation characteristics.

Third Embodiment

Figure 8:
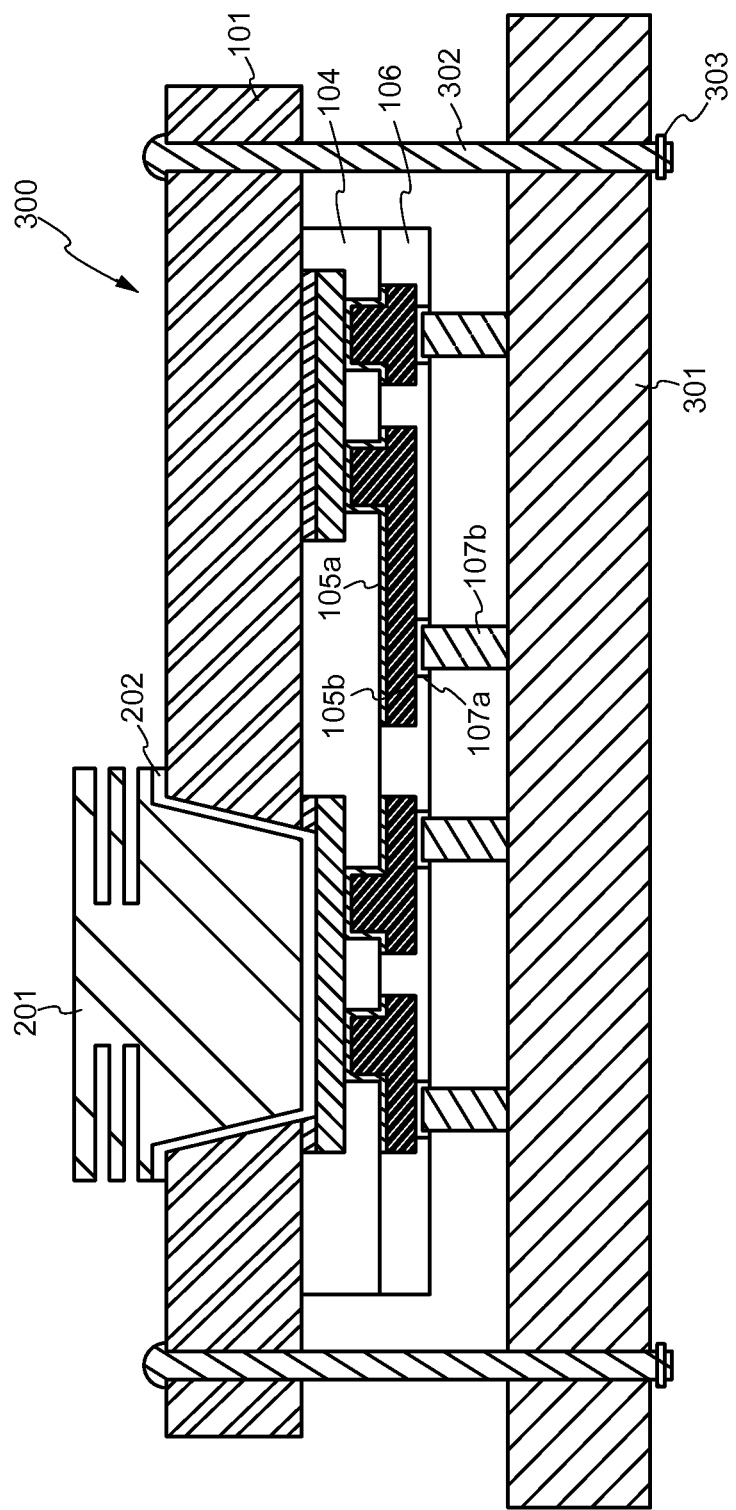
FIG. 8 is a cross-sectional view of a semiconductor package related to a third embodiment of the present invention.

FIG. 8 shows a cross-sectional view of a semiconductor package 300 related to the third embodiment of the present invention. Semiconductor package 300 related to the third embodiment is different from semiconductor package 200 of the second embodiment in that fixing holes are arranged through the support substrate 101 on the outer peripheral part (part where the support substrate 101 is exposed), and the support substrate 101 is fixed to a mounting board (printed circuit board). Other points are the same as the semiconductor package 300 related to the second embodiment.

In FIG. 8, numbering 301 is a mounting substrate, and wires connecting electronic components and integrated circuits are mounted at high density. In the present embodiment, a hole is arranged on the outer periphery of the support substrate 101 and the mounting substrate 301, and the semiconductor package 200 and the mounting substrate 301 are fixed by fixing pin 302 and fixing nut 303 that pass through both.

At this time, electronic components and integrated circuits on the mounting substrate 301 are connected with the external terminal 107 arranged on the semiconductor package 300, thereby electronic components, integrated circuits on the mounting substrate 301 and semiconductor device 103a and 103b can be connected.

By physically fixing the support substrate 101 to the mounting substrate 301, in addition to the effects of excellent heat dissipation characteristics, semiconductor package 300 related to the third embodiment of the present invention achieves the effect of improving impact resistance due to increased fixing strength. This effect is particularly useful when the semiconductor package of the present invention is placed in an operating environment with severe vibration such as in a car.

Fourth Embodiment

Figure 9:
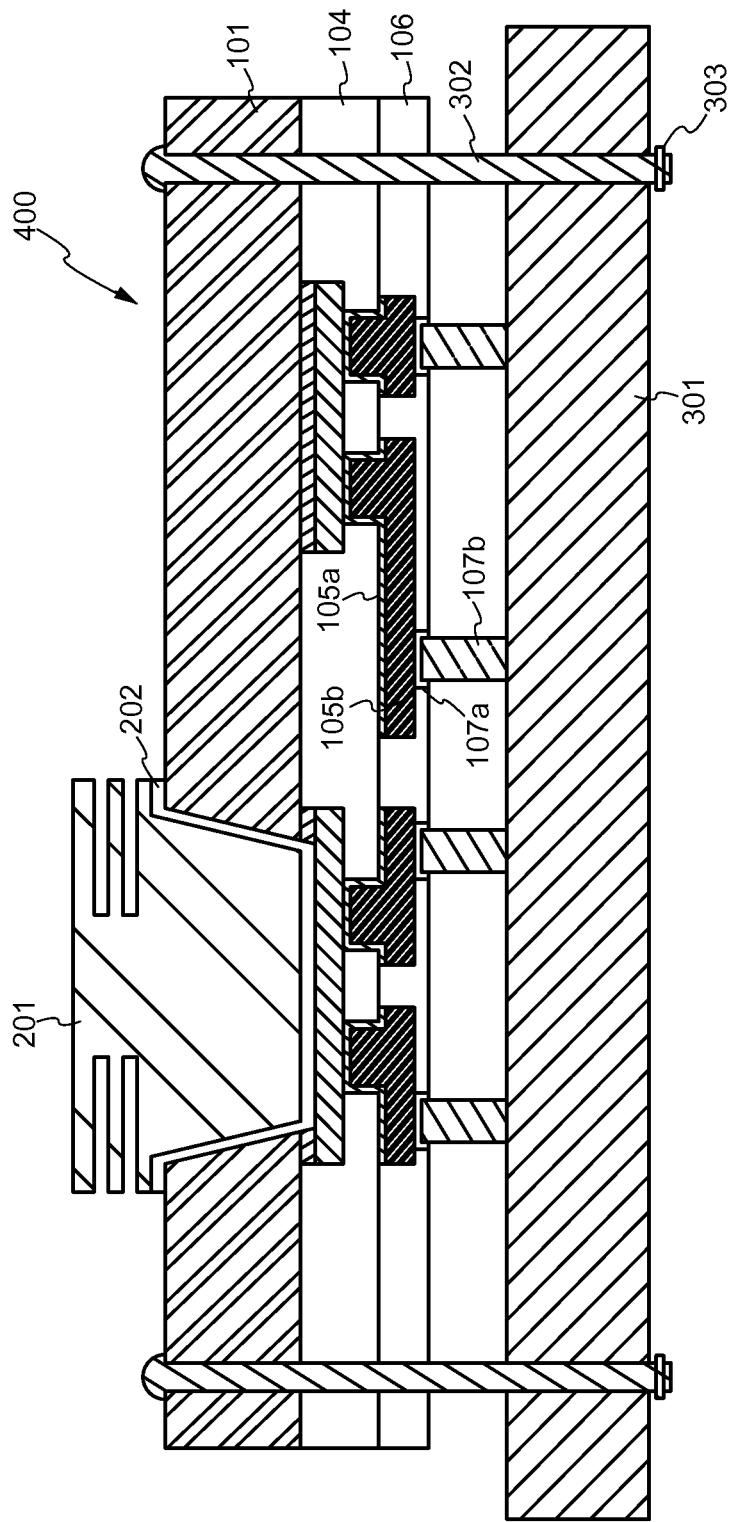
FIG. 9 is a cross-sectional view of a semiconductor package related to a fourth embodiment of the present invention.

FIG. 9 shows a cross-sectional view of a semiconductor package 400 related to the fourth embodiment of the present invention. The semiconductor package 400 related to the fourth embodiment is different from the semiconductor package 300 of the third embodiment in that fixing holes which pass through the support substrate 101, the first sealing part 104 and the second sealing part 106 are arranged at its end and the support substrate 101 is fixed to the mounting substrate (printed circuit board). Other points are the same as the semiconductor package 300 related to the third embodiment.

By physically fixing the support substrate 101 to the mounting substrate 301, in addition to the effects of excellent heat dissipation characteristics, semiconductor package 400 related to the fourth embodiment of the present invention achieves the effect of improving impact resistance due to increased fixing strength. This effect is particularly useful when the semiconductor package of the present invention is placed in an operating environment with severe vibration such as in a car.

Fifth Embodiment

Figure 10:
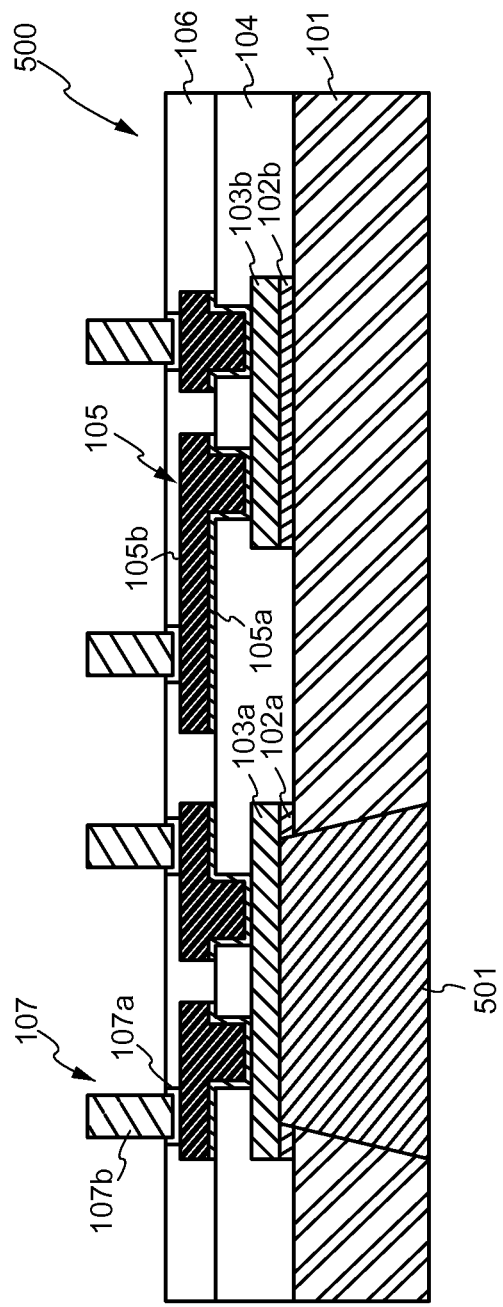
FIG. 10 is a cross-sectional view of a semiconductor package related to a fifth embodiment of the present invention.

FIG. 10 shows a cross-sectional view of a semiconductor package 500 related to the fifth embodiment of the present invention. Semiconductor package 500 related to the fifth embodiment is different from semiconductor package 100 of the first embodiment in that the first aperture 108 is filled with a metal-filled part 501. Other points are the same as the semiconductor package 100 related to the first embodiment.

In FIG. 10, metal-filled part 501 is formed so as fill the first aperture 108 using a metallic material, and the exposed surface to the exterior and the rear side of the support substrate 101 are substantially the same plane. As metal-filled part 501, copper (Cu), an alloy of copper and tin (CuSn), or a structure filled with a metallic material such as silver (Ag) (eg, Cu paste, CuSn paste, Ag paste) may be adopted. In addition, a known metal embedding technique may be used such as a tungsten plug.

By arranging the semiconductor package 500 related to the fifth embodiment of the present invention with the metal-filled part 501 as a heat dissipation part, and forming only the interior of the first aperture 108 as a heat dissipation part, the heat dissipation part does not protrude from the support substrate 101, and it is possible to suppress the height (thickness) of a semiconductor package as a whole. In this way, in addition to the effect of excellent heat dissipation characteristics, it is possible to achieve miniaturization of the semiconductor package.

Sixth Embodiment

Figure 11:
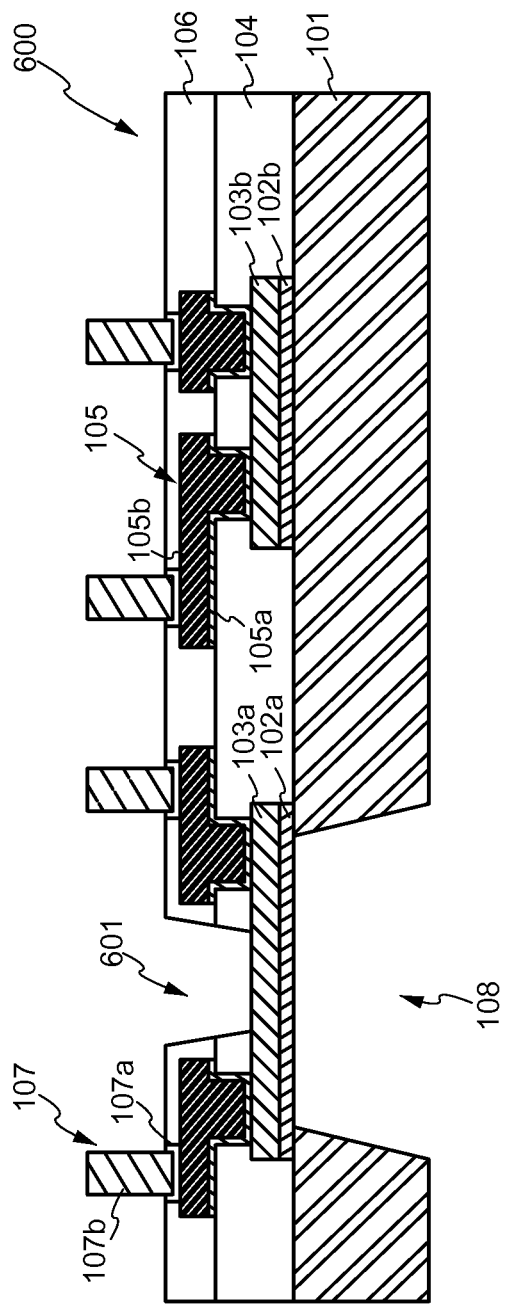
FIG. 11 is a cross-sectional view of a semiconductor package related to a sixth embodiment of the present invention.

FIG. 11 shows a cross-sectional view of a semiconductor package 600 related to the sixth embodiment of the present invention. Semiconductor package 600 related to the sixth embodiment is different from the semiconductor package 100 of the first embodiment in that in addition to the first aperture 108, a second aperture 601 is also arranged in a circuit formation surface of the semiconductor device 103a. Other points are the same as the semiconductor package 100 related to the first embodiment.

In FIG. 11, the second aperture 601 is formed on the upper side of the semiconductor device 103a (circuit forming surface side) by etching the first sealing part 104 and the second sealing part 106. Therefore, the second aperture 601 reaches the circuit forming surface of the semiconductor device 103a. In this case, it is desirable that an etchant or etching gas are selected so that the selection ratio of the circuit forming surface between the first sealing part 104 and the semiconductor device 103a can be secured.

In the semiconductor package 600 related to the sixth embodiment of the present invention, by arranging the first aperture 108 on the lower side of semiconductor device 103a (support substrate side), and arranging the second aperture 601 on the upper side of the semiconductor device 103a (circuit forming surface), it is possible to realize a highly reliable semiconductor package with more excellent heat dissipation characteristics.

Seventh Embodiment

Figure 12:
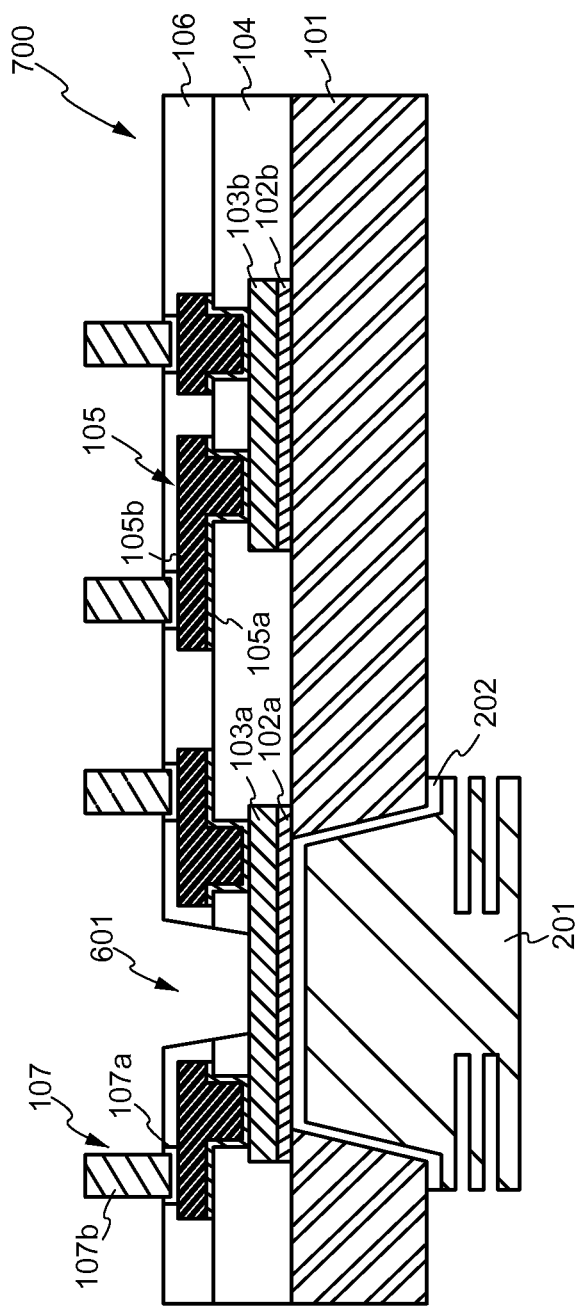
FIG. 12 is a cross-sectional view of a semiconductor package related to a seventh embodiment of the present invention.

FIG. 12 shows a cross-sectional view of a semiconductor package 700 related to the seventh embodiment of the present invention. Semiconductor package 700 related to the seventh embodiment is different from the semiconductor package 200 of the second embodiment in that in addition to the configuration of providing the heat sink 201 to the first aperture 108, the second aperture 601 is also arranged in the circuit formation surface of the semiconductor device 103a. Other points are the same as the semiconductor package 200 related to the second embodiment.

Heat dissipation characteristics of the semiconductor package 700 shown in FIG. 12 are further increased by applying the heat dissipation to the upper and lower surfaces of the semiconductor device 103a. Specifically, the first aperture 108 is arranged in the support substrate 101 on the lower side of the semiconductor device 103a and the heat sink 201 is arranged therein via the heat dissipation adhesive 202. In addition, the second aperture 601 is arranged in the first sealing part 104 and the second sealing part 106 on the upper side of the semiconductor device 103a.

Since the specific materials constituting the heat sink 201 are the same as in the second embodiment, a description thereof is omitted here. In addition, the same as in the second embodiment a heat sink and heat spreader may be used in combination. Furthermore, the second aperture 601 is the same as that described in the sixth embodiment.

By providing the semiconductor package 700 related to the seventh embodiment of the present invention with a state in which the circuit formation surface of the semiconductor device 103a is exposed to the outside air (the circuit forming surface may also be protected with a protective film in advance), after bringing a heat sink or heat spreader which is the semiconductor device 103a and heat dissipation part close together, it is possible to effectively dissipate heat emitted by the semiconductor device 103a in a vertical direction. Therefore, it is possible to realize a highly reliable semiconductor package with more excellent heat dissipation characteristics.

Eighth Embodiment

Figure 13:
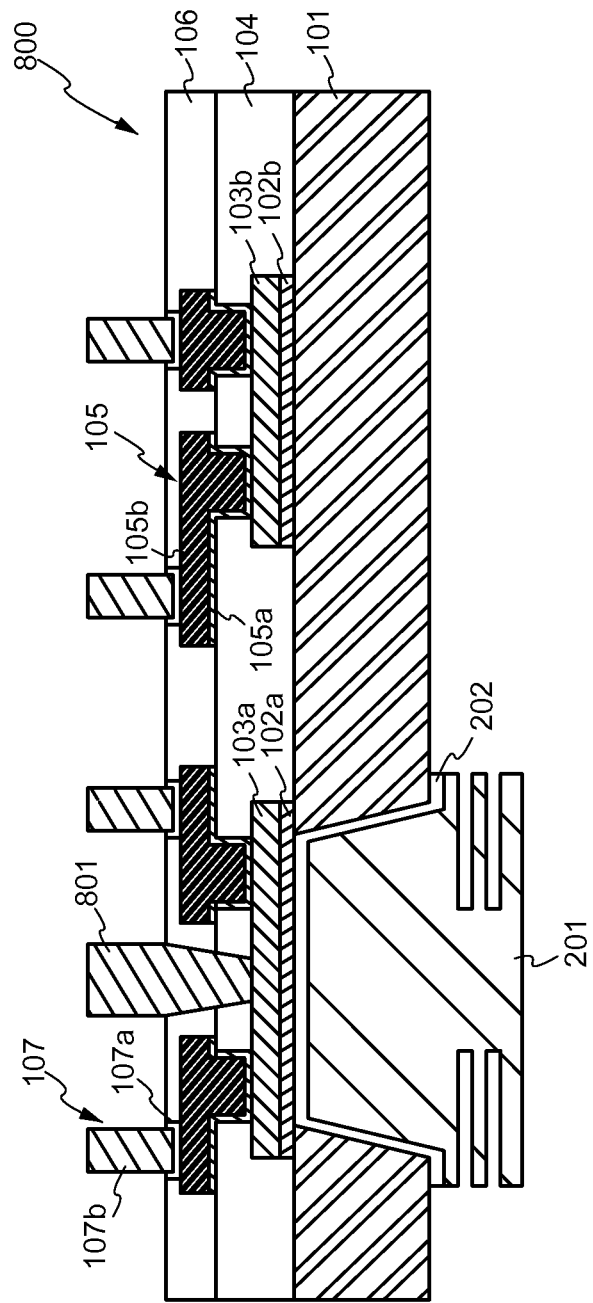
FIG. 13 is a cross-sectional view of a semiconductor package related to an eighth embodiment of the present invention.

FIG. 13 shows a cross-sectional view of a semiconductor package 800 related to the eighth embodiment of the present invention. Semiconductor package 800 related to the eighth embodiment is different from the semiconductor package 200 of the second embodiment in that in addition to the configuration of providing the heat sink 201 to the first aperture 108, the second aperture 601 is also arranged on the circuit formation surface of the semiconductor device 103a, and a metal part 801 is arranged as a heat dissipation part therein. Other points are the same as the semiconductor package 200 related to the second embodiment.

The heat dissipation characteristics of the semiconductor package 800 shown in FIG. 13, similar to the seventh embodiment, are increased by applying a heat dissipation to the upper and lower surfaces of the semiconductor device 103a. Specifically, a configuration is adopted in which the heat sink 201 is arranged on the lower side of the semiconductor device 103a, and a metal part 801 is arranged on the upper side of the semiconductor device 103a, thereby, the heat dissipation part is brought close to the upper and lower sides of the semiconductor device 103a and the heat emitted by semiconductor device 103a is actively dissipated. In this way, a highly reliable semiconductor package 800 related to the eighth embodiment of the present invention can be realized with more excellent in heat dissipation characteristics.

Ninth Embodiment

Figure 14:
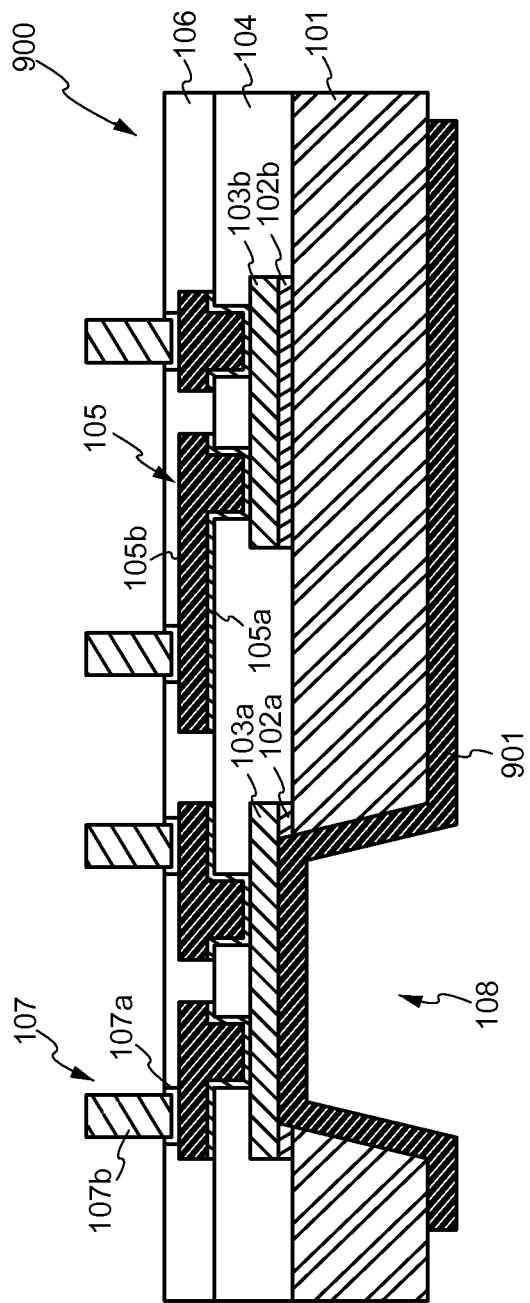
FIG. 14 is a cross-sectional view of a semiconductor package related to a ninth embodiment of the present invention.

FIG. 14 shows a cross-sectional view of a semiconductor package 900 related to a ninth embodiment of the present invention. Semiconductor package 900 related to the ninth embodiment is different from the semiconductor package 100 of the first embodiment in that a conductive pattern 901 is formed so as to cover the inner wall of the first aperture 108. Other points are the same as the semiconductor package 100 related to the first embodiment.

In semiconductor package 900 shown in FIG. 14, after the first aperture 108 is formed in the support substrate 101, by forming a conductive pattern 901 comprised from copper from the rear surface of the semiconductor device 103a over the rear surface of the support substrate 101, the function of a heat dissipation part and the function of wiring is provided to the conductive pattern 901. Here, although copper is exemplified, a conductive pattern composed of aluminum, silver or other metal materials may be used.

In the case where the semiconductor device 103a is a power device (in particular, in the case of power devices using a MOSFET using a Si wafer, an IGBT-based power device, or SiC wafer), since the current flows in a vertical direction (vertical direction of the semiconductor device), the current can be extracted even from the rear surface side of the semiconductor device 103a.

Therefore, in the semiconductor package 900 related to the ninth embodiment, it is possible provide the copper conductive pattern 901 with functions of a wiring (conductive path) where a current is extracted from the rear surface side of the power device 103a and the function of an electrode. Of course, when it is not used as a wiring or electrode, it functions as a heat dissipating part to dissipate heat.

In addition, when using the conductive pattern 901 as a wiring, although wiring pattern is formed by photolithography on the rear surface of the support substrate 101, since such a thin line pattern increases the effective surface area, the heat dissipation effect is also increased. Therefore, considering its use as a heat dissipation part not only used as a wiring, it is intentionally possible to increase the surface area as the wiring pattern such as to draw a geometric pattern and increase the heat dissipation effect.

By providing semiconductor package 900 related to the ninth embodiment of the present invention with a structure that connects the conductive pattern on the rear surface of the semiconductor device 103a, in addition to the effect of excellent heat dissipation characteristics, in the case where the semiconductor device 103a is a power device for flowing a current in a vertical direction, it is possible to actively use it as a wiring or an electrode.

What is claimed is:

1. A semiconductor package comprising:
a support substrate arranged with a first aperture reaching a semiconductor device on a rear side;
the semiconductor device bonded via an adhesive to a surface of the support substrate;
an insulating layer covering the semiconductor device; and
a wiring on the insulating layer for connecting the semiconductor device and an external terminal via a contact hole in the insulating layer.

2. The semiconductor package according to claim 1 wherein the adhesive forms a part of the first aperture.

3. The semiconductor package according to claim 1 wherein part of the semiconductor device is exposed to the outside air through the first aperture.

4. The semiconductor package according to claim 1 wherein a heat dissipation part is arranged in the first aperture via a heat dissipation adhesive.

5. The semiconductor package according to claim 1 wherein a metallic material is filled into the first aperture.

6. The semiconductor package according to claim 1 wherein a conductive pattern covering the first aperture is arranged.

7. The semiconductor package according to claim 1 wherein the external terminal is a pin-shaped conductor or solder ball.

8. The semiconductor package according to claim 1 wherein the semiconductor device is a power device.

9. A semiconductor package comprising:
a support substrate arranged with a first aperture reaching a semiconductor device on a rear side;
the semiconductor device bonded via an adhesive to a surface of the support substrate;
an insulating layer covering the semiconductor device; and
a wiring for connecting the semiconductor device and an external terminal through the insulating layer,
wherein a second aperture reaching the semiconductor device is arranged on the insulation layer.

10. The semiconductor package according to claim 9 wherein a part of the semiconductor device is exposed to the outside air via the second aperture.

11. The semiconductor package according to claim 9 wherein a heat dissipation part is arranged in the second aperture.

12. A method of manufacturing a semiconductor package comprising:
bonding a semiconductor device on a surface of a support substrate via an adhesive;
covering the semiconductor device with an insulating layer;
forming a wiring on the insulating layer for connecting the semiconductor device and an external terminal via a contact hole in the insulating layer; and
forming a first aperture reaching the semiconductor device on a rear side of the support substrate.

13. The method of manufacturing a semiconductor package according to claim 12 wherein forming the first aperture reaching the semiconductor device on the rear surface side of the support substrate includes forming an aperture by etching the rear surface side of the support substrate and etching the adhesive using the aperture as a mask.

14. The method of manufacturing a semiconductor package according to claim 12 wherein a heat dissipation part is formed in the first aperture using heat dissipation adhesive after forming the first aperture.

15. The method of manufacturing a semiconductor package according to claim 12 wherein a metal material is filled into the first aperture after forming the first aperture.

16. The method of manufacturing a semiconductor package according to claim 12 wherein a conductive pattern covering the first aperture is formed after forming the first aperture.

17. The method of manufacturing a semiconductor package according to claim 12 wherein as second aperture is formed reaching the semiconductor device on the insulating layer.

18. The method of manufacturing a semiconductor package according to claim 17 wherein a heat dissipation part is formed in the second aperture.

19. The method of manufacturing a semiconductor package according to claim 12 wherein the external terminal is a pin-shaped conductor or solder ball.

20. The method of manufacturing a semiconductor package according to claim 12 wherein the semiconductor device is a power device.

* * * * *